United States Patent
Bilek et al.

(10) Patent No.: US 9,379,744 B2
(45) Date of Patent: Jun. 28, 2016

(54) SYSTEM AND METHOD FOR DIGITAL PREDISTORTION

(71) Applicant: Honeywell International Inc., Morristown, NJ (US)

(72) Inventors: Jan Bilek, Brno (CZ); Alfonso Malaga, Sammamish, WA (US); Radek Zaruba, Decin (CZ); Vit Stencel, Brno (CZ); Martin Mlaskac, Kanice (CZ)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/488,026

(22) Filed: Sep. 16, 2014

(65) Prior Publication Data
US 2016/0080009 A1    Mar. 17, 2016

(51) Int. Cl.
*H04B 1/04* (2006.01)
*H04L 25/02* (2006.01)

(52) U.S. Cl.
CPC .......... *H04B 1/0475* (2013.01); *H04L 25/0214* (2013.01); *H04B 2001/0425* (2013.01)

(58) Field of Classification Search
CPC ...... H04B 1/04; H04B 1/0408; H04B 1/0425; H04B 1/0458; H04B 1/0475; H04B 2001/0425; H04L 1/0042; H04L 25/0214
USPC .......... 375/278, 284, 285, 295–297; 330/149; 381/94.1, 94.4, 94.7, 119, 120; 455/67.13, 114.2, 114.3
See application file for complete search history.

(56) References Cited

U.S. PATENT DOCUMENTS

| | | | |
|---|---|---|---|
| 5,870,668 A | 2/1999 | Takano et al. | |
| 5,903,823 A | 5/1999 | Moriyama et al. | |
| 6,091,941 A | 7/2000 | Moriyama et al. | |
| 6,430,412 B1 | 8/2002 | Hogg et al. | |
| 6,720,829 B2 | 4/2004 | Matsuyoshi et al. | |

(Continued)

FOREIGN PATENT DOCUMENTS

EP    2403314    1/2012

OTHER PUBLICATIONS

Xu, Jinbiao, "Practical Digial Pre-Distortion Techniques for PA Linearization in 3GPP LTE", 2010, pp. 122, Publisher: Agilent Technologies.

(Continued)

*Primary Examiner* — Young T Tse
(74) *Attorney, Agent, or Firm* — Fogg & Powers LLC

(57) ABSTRACT

The radio system comprises a radio unit and an antenna unit coupled to the radio unit. The antenna unit is physically separate and located remote from the radio unit. The antenna unit further comprises a digital pre-distortion engine configured to pre-distort a modulated digital data signal; a digital to analog converter configured to convert the pre-distorted digital data signal to a pre-distorted analog data signal; and a power amplifier configured to amplify the pre-distorted analog data signal which distorts the pre-distorted analog data signal. The distortion introduced by the power amplifier is opposite to the pre-distortion introduced by the digital pre-distortion engine such that the pre-distortion introduced by the digital pre-distortion engine approximately cancels the distortion introduced by the power amplifier. The radio unit further comprises a coefficient computation engine configured to calculate coefficients used by the digital pre-distortion engine to pre-distort the modulated digital data signal.

17 Claims, 4 Drawing Sheets

(56) References Cited

U.S. PATENT DOCUMENTS

| | | | |
|---|---|---|---|
| 6,798,843 B1 * | 9/2004 | Wright | H03F 1/3241 330/149 |
| 6,999,523 B2 | 2/2006 | Posti | |
| 7,068,980 B2 | 6/2006 | Seo et al. | |
| 7,142,615 B2 | 11/2006 | Hongo et al. | |
| 7,149,257 B2 | 12/2006 | Braithwaite | |
| 7,221,221 B2 | 5/2007 | Bouny | |
| 7,242,247 B2 | 7/2007 | Hirose et al. | |
| 7,415,250 B2 | 8/2008 | Sasaki et al. | |
| 7,493,152 B1 * | 2/2009 | Fifield | H04B 7/061 455/41.1 |
| 7,580,686 B2 | 8/2009 | Fonden et al. | |
| 7,680,467 B2 | 3/2010 | Ishigami | |
| 7,746,955 B2 | 6/2010 | Rexberg | |
| 7,772,925 B2 | 8/2010 | Bouny | |
| 7,831,255 B1 | 11/2010 | Gribble et al. | |
| 7,856,069 B2 | 12/2010 | Nagatani et al. | |
| 7,924,942 B2 | 4/2011 | Rexberg | |
| 7,929,927 B2 | 4/2011 | Norris et al. | |
| 8,179,989 B2 | 5/2012 | Toyomane et al. | |
| 8,213,884 B2 | 7/2012 | Kim et al. | |
| 8,294,516 B2 | 10/2012 | Young et al. | |
| 8,391,809 B1 | 3/2013 | Fuller | |
| 8,412,132 B2 | 4/2013 | Tang et al. | |
| 8,417,197 B2 | 4/2013 | Farahani Samani et al. | |
| 8,498,591 B1 * | 7/2013 | Qian | H04B 1/0475 375/297 |
| 8,548,403 B2 | 10/2013 | Kim et al. | |
| 8,571,495 B2 | 10/2013 | Nagatani et al. | |
| 8,588,711 B2 | 11/2013 | Ishikawa et al. | |
| 8,606,197 B2 | 12/2013 | Bai | |
| 8,618,880 B2 | 12/2013 | Young et al. | |
| 8,706,062 B1 | 4/2014 | Yu et al. | |
| 8,711,976 B2 | 4/2014 | Chandrasekaran | |
| 8,787,487 B2 | 7/2014 | Nagatani et al. | |
| 2001/0007435 A1 * | 7/2001 | Ode | H03F 1/3247 330/149 |
| 2003/0207680 A1 * | 11/2003 | Yang | H03F 1/3247 455/341 |
| 2004/0022210 A1 * | 2/2004 | Frank | H04W 88/02 370/328 |
| 2004/0189378 A1 * | 9/2004 | Suzuki | H03F 1/0288 330/52 |
| 2005/0168283 A1 | 8/2005 | Suzuki et al. | |
| 2005/0184803 A1 | 8/2005 | Hirose et al. | |
| 2005/0212708 A1 * | 9/2005 | Fifield | H01Q 9/0421 343/702 |
| 2005/0215249 A1 | 9/2005 | Little et al. | |
| 2006/0012426 A1 | 1/2006 | Nezami | |
| 2009/0088093 A1 | 4/2009 | Nentwig | |
| 2012/0195392 A1 | 8/2012 | Kushnir et al. | |
| 2012/0321018 A1 * | 12/2012 | Chen | H03F 1/3247 375/296 |
| 2012/0328050 A1 | 12/2012 | Bai et al. | |
| 2013/0243125 A1 * | 9/2013 | Matsubara | H04B 1/62 375/297 |
| 2014/0294120 A1 * | 10/2014 | Gandhi | H03F 1/3241 375/297 |

OTHER PUBLICATIONS

European Patent Office, Extended European Search Report from EP Application No. 15185373.6 mailed Jan. 14, 2016, pp. 1-8, Published in: EP.

* cited by examiner

SYSTEM AND METHOD FOR DIGITAL PREDISTORTION

BACKGROUND

Current Radio Frequency (RF) High Power Amplifiers (HPAs) are often the most power consuming, heaviest and/or largest element inside communication, navigation & surveillance airborne radios. Thus, it is desirable to improve performance of contemporary High Power Amplifiers.

SUMMARY

In one embodiment, a radio system is provided. The radio system comprises a radio unit comprising a modulator configured to modulate a digital data signal and a signal interface. The radio system also comprises an antenna unit comprising a signal interface and a cable coupling the signal interface of the radio unit to the signal interface of the antenna unit. The antenna unit is physically separate from the radio unit and located remote from the radio unit. The antenna unit further comprises a digital pre-distortion engine configured to receive the modulated digital data signal and to pre-distort the modulated digital data signal; a digital to analog converter configured to convert the pre-distorted digital data signal to a pre-distorted analog data signal; and a power amplifier configured to amplify the pre-distorted analog data signal which distorts the pre-distorted analog data signal. The distortion introduced by the power amplifier is opposite to the pre-distortion introduced by the digital pre-distortion engine such that the pre-distortion introduced by the digital pre-distortion engine approximately cancels the distortion introduced by the power amplifier. The radio unit further comprises a coefficient computation engine configured to calculate coefficients used by the digital pre-distortion engine to pre-distort the modulated digital data signal.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
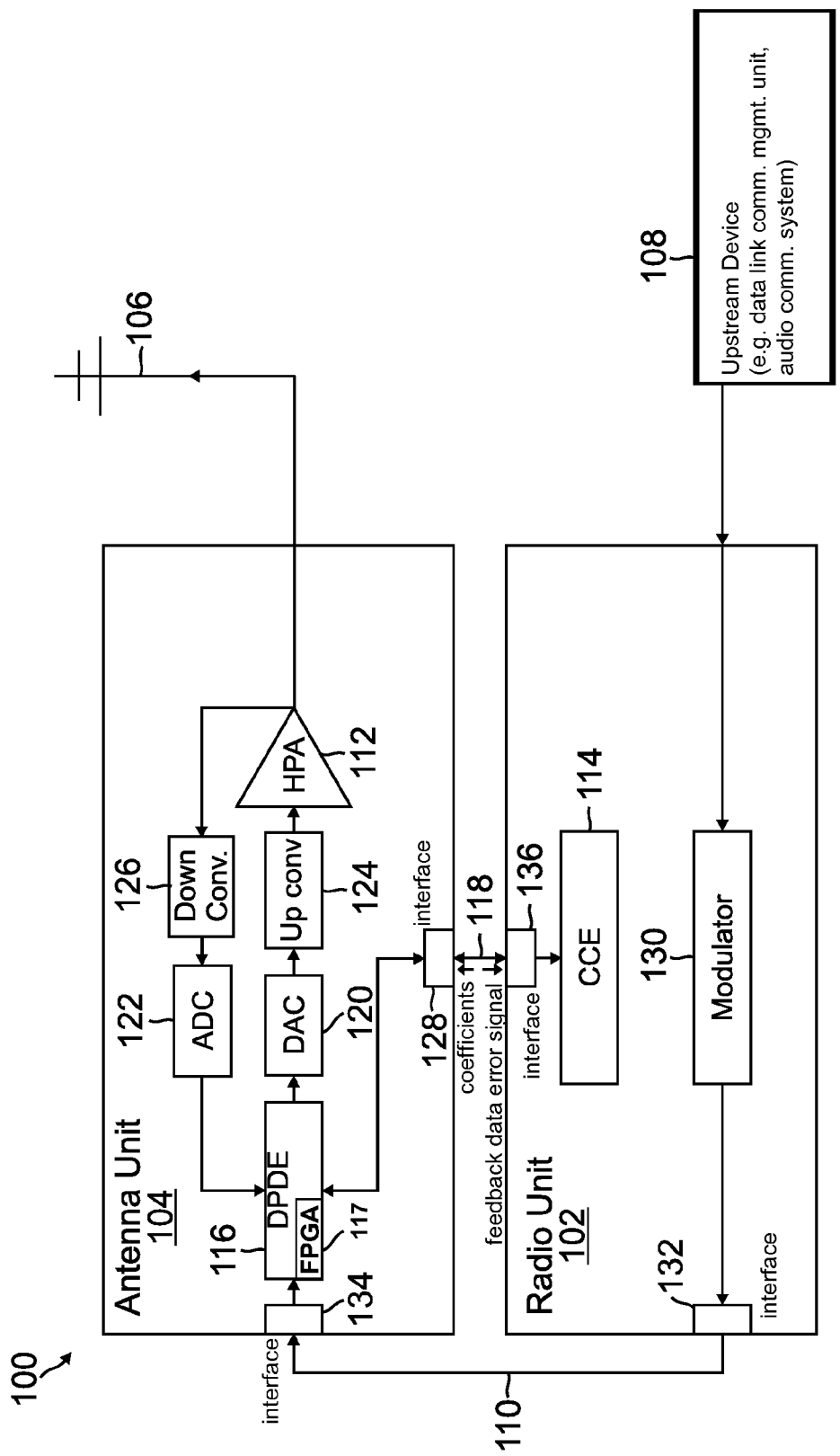
FIG. 1A is a high level block diagram of one embodiment of an exemplary radio system.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

FIG. 1A is a high level block diagram of one embodiment of an exemplary radio system 100. Radio system 100 includes a radio unit 102 and an antenna unit 104. It is to be understood that the radio system 100 can include other component not shown and that FIG. 1A has been simplified for purposes of explanation. Similarly, each of the radio unit 102 and the antenna unit 104 may include additional components, as understood by one of skill in the art, and that depiction of the radio unit 102 and antenna unit 104 has been simplified for purposes of explanation.

Figure 2:
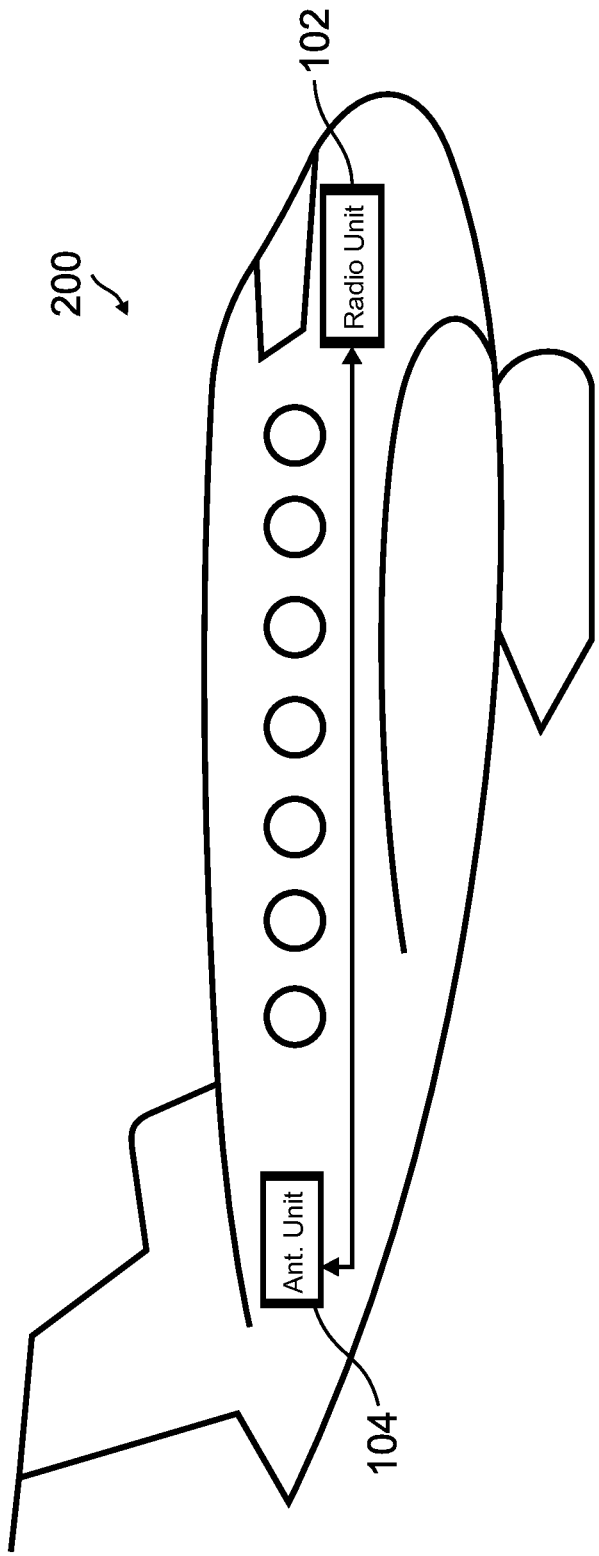
FIG. 2 is a high level block diagram of one embodiment of an exemplary radio system on an aircraft.

The radio unit 102 is located physically separate from the antenna unit 104. In particular, the antenna unit 104 can be co-located or located near an antenna 106 configured to radiate radio frequency (RF) signals. The radio unit 102 can be located, for example, inside the avionics bay of an aircraft. For example, as depicted in the exemplary FIG. 2, the radio unit 102 is located in an avionics bay in the nose of the aircraft 200 and the antenna unit 104 is located near a tail of the aircraft 200 near a corresponding antenna. The radio unit 102 is waveform/platform independent and is configured to process signals from an upstream device 108 for transmission as an RF signal via the antenna 106.

The upstream device 108 can be implemented as any device for providing data to be transmitted. For example, the upstream device 108 can be implemented as, but is not limited to, a data link Communications Management Unit (CMU) or an audio communications system. Thus, the radio unit 102 and the antenna unit 104 can be implemented as different types of radios, such as communications, navigation, and surveillance radios. In addition, the radio system 100 can be implemented as, but not limited to, a satellite communications (SATCOM) radio, an ultra-high frequency (UHF) radio, or a very high frequency (VHF) radio. The radio unit 102 includes a modulator 130 configured to modulate the signals provided by the upstream device using techniques known to one of skill in the art. The modulated signals are then provided to the antenna unit 104 via port or interface 132. The interface 132 is coupled to a corresponding interface 134 in the antenna unit 104 by a physical medium 110 between the antenna unit 104 and the radio unit 102. The physical medium 110 can be implemented as any appropriate media for carrying data signals, such as, but not limited to, coaxial cable, twisted pair copper wire, or fiber optic cable.

The antenna unit 104 is configured to amplify the power of the modulated signal received from the radio unit 102 via a high power amplifier 112. The amplified signal is then output to the antenna 106 from which the amplified signal is radiated. As known to one of skill in the art, however, high power amplifiers often have non-linear components in the amplifier transfer function which causes distortions in the amplified signal. These distortions modify the desired signal or add frequencies other than the intended frequency of the radiated signal. This way, interference can be caused on other RF channels by the non-linear components of the amplifier transfer function. The non-linearity in the amplifier transfer function typically increases as the output of the high power amplifier 112 approaches the saturation level or maximum output of the high power amplifier. Conventional systems often use larger power amplifiers that are operated at a lower level to reduce the effects of non-linearity. However, the use of larger power amplifiers in this conventional manner is inefficient. In such conventional power amplifiers, a lot of current is drawn from the power supply line and a lot of unwanted heat is dissipated into the environment around the antenna unit 104.

Moreover, these conventional power amplifiers are heavy because of a large heat sink to dissipate high thermal power.

System 100, however, pre-distorts the signal from the radio unit 102 prior to passing the signal through the high power amplifier 112. In particular, the signal is pre-distorted in a manner opposite to the distortion introduced by the high power amplifier 112 such that the pre-distortion approximately cancels out the distortion created by the high power amplifier 112. The pre-distortion function is split between the radio unit 102 and the antenna unit 104. In particular, the radio unit 102 includes a coefficient computation engine (CCE) 114 and the antenna unit 104 includes a digital pre-distortion engine (DPDE) 116.

The coefficient computation engine 114 calculates coefficients for use by the digital pre-distortion engine 116. In particular, the digital pre-distortion engine 116 applies a mathematical function, such as a polynomial function, to the modulated digital data signal received from the radio unit 102. The coefficients of the mathematical function are computed in the coefficient computation engine 114 of radio unit 102. The pre-distorted digital signal output from the digital pre-distortion engine 116 is then converted to an analog signal in the Digital to Analog Converter (DAC) 120 and up-converted from a baseband or an intermediate frequency to a radio frequency in Up converter 124. The analog RF signal is then amplified in the high power amplifier 112. The amplified RF signal is then radiated via the antenna 106.

A feedback loop from the output of the high power amplifier 112 is provided back to the digital pre-distortion engine 116. The feedback signal from the output of the high power amplifier 112 is down converted to a baseband or an intermediate frequency in the down converter 126 and then converted to a digital signal in the Analog to Digital Converter (ADC) 122. Based on the feedback signal, HPA model, and knowledge of the desired signal, the digital pre-distortion engine 116 calculates feedback data that is used by the coefficient computation engine 114 to update or calculate new coefficients. For example, in this embodiment, the feedback data is an error signal which represents a difference between the digital down converted feedback signal and the modulated data signal input into the digital pre-distortion engine 116. However, it is to be understood that, in other embodiments, different kinds of feedback data can be used in addition to or in lieu of an error signal based on the type of algorithm used for computing the coefficients. For example, in some other embodiments, the error signal represents the difference between the output of the DPDE 116 and a post-distorted version of the feedback signal. In other embodiments, the feedback data includes samples from the output of the DPDE 116 and samples from the feedback signal from the output of the power amplifier 112. In some such embodiments, the number of samples from the feedback signal is greater than the number of samples from the output of the DPDE 116. For example, the number of samples from the output of DPDE 116 can be 400 while the number of samples from the feedback signal is 1000 in one embodiment. Having more samples from the feedback signal enables the CCE 114 to determine the delay through the up-converter 124, power amplifier 112, and down-converter 126 and "align" the samples from the DPDE 116 with the corresponding block of samples from the feedback signal. The periodicity of providing the samples to the CCE 114 determines how often the pre-distortion coefficients are re-calculated. The blocks of data samples do not have to include 100% of the DPDE 116 output or power amplifier 112 output so the amount of data fed back to the CCE 114 is lower than a feedback signal of a continuous stream of error signal samples.

Figure 1B:
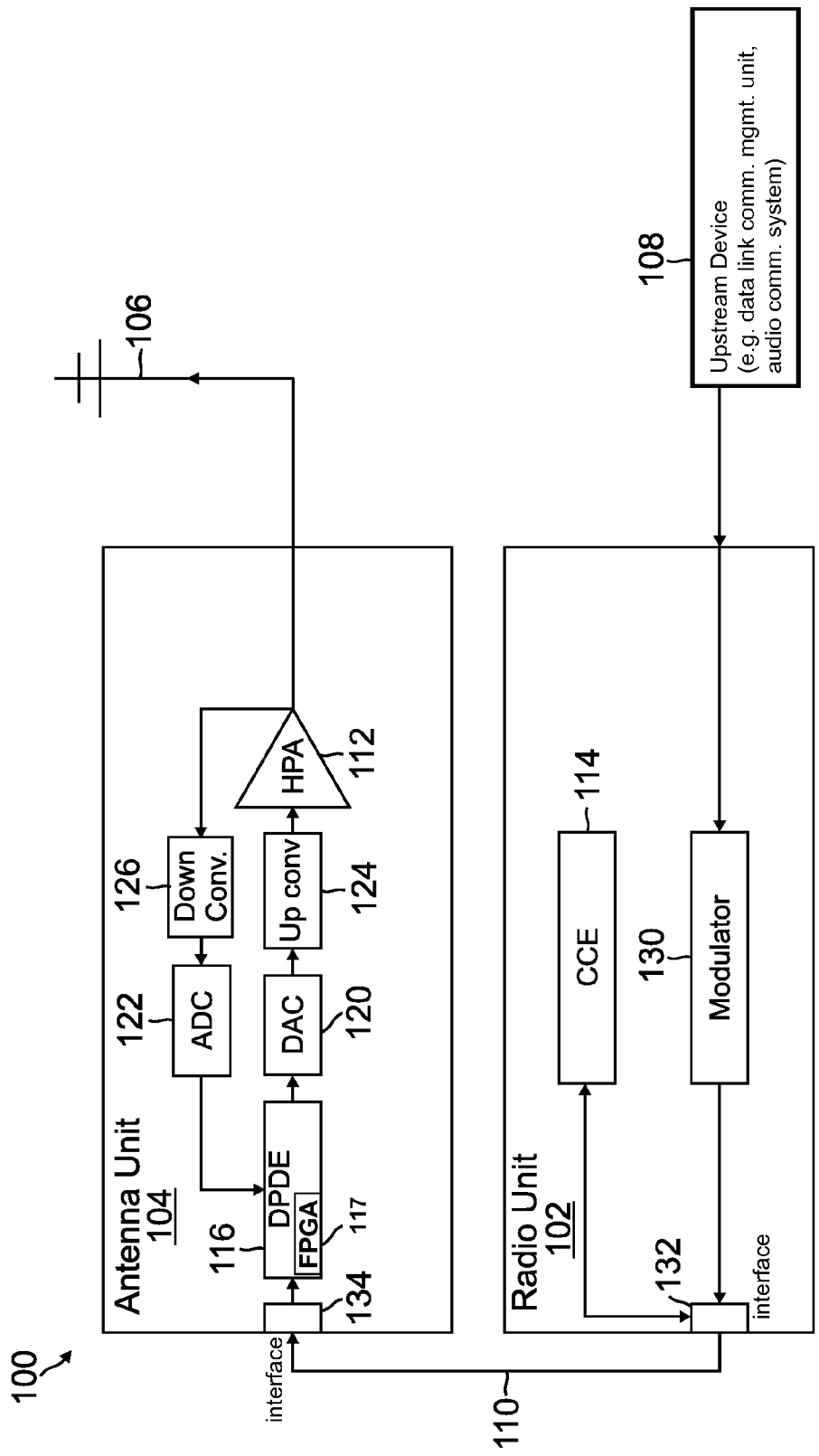
FIG. 1B is a high level block diagram of another embodiment of an exemplary radio system.

The digital pre-distortion engine 116 outputs the error signal to the coefficient computation engine 114 via an interface 128, in this embodiment. The interface 128 is coupled to a corresponding interface 136 in the radio unit 102 by a physical medium 118. Physical medium 118 can be implemented using coaxial cable, fiber optic cable, twisted pair copper wire, etc. Although a separate medium 118 and corresponding interfaces 128/136 are used in this embodiment, it is to be understood that, in other embodiments, the error signal is provided to the radio unit over the physical medium 110 and corresponding interfaces 134/132, as shown for example in FIG. 1B. Based on the error signal, the coefficient computation engine 114 calculates new/updated coefficients. The new coefficients are then output from coefficient computation engine 114 back to the digital pre-distortion engine 116 via the physical medium 118, in this example. However, in the example embodiment shown in FIG. 1B, the updated coefficients are output from the CCE 114 to the DPDE 116 via the physical medium 110.

The new coefficients are then used by the digital pre-distortion engine 116 in the mathematical equation to pre-distort the input data signal. Thus, the feedback loop enables adjustment of the pre-distortion to improve the correspondence between the digital pre-distortion and the distortion from the high power amplifier 112 such that the pre-distortion effectively cancels out the distortion from the high power amplifier 112. For example, as the power amplifier heats up or the environmental conditions change, the temperature rises or decreases and the performance or behavior of the amplifier 112 changes as well. By periodically calculating updated coefficients based on the error signal, the pre-distortion can be adjusted to compensate for such changes. The coefficients do not have to be calculated in real time. Rather, an appropriate period can be pre-determined for calculating the coefficients depending on the application. For example, the period can be, but is not limited to, once per second, once per minute, once per hour, etc.

By splitting the pre-distortion function between the radio unit 102 and the antenna unit 104, as described above, the embodiments described herein enable benefits not achieved by implementing the pre-distortion function in a single device. In particular, the pre-distortion function is split to utilize more efficiently the respective hardware in the radio unit 102 and antenna unit 104. For example, application of the mathematical operation to pre-distort the data signal should be performed quickly in order to reduce latency between the input of the data signal and the output of the pre-distorted data signal. In particular, as the processing time for applying the pre-distortion mathematical operation approaches real time, the less latency is introduced by the pre-distortion.

In addition, the type of operation or algorithm used to apply the pre-distortion is typically different from the type of operation to compute the coefficients for the pre-distortion mathematical operation. For example, the pre-distortion mathematical operation typically involves relatively simple linear operations, such as multiply and accumulate operations. In contrast, the computation of the coefficients often involves more complex operations, such as performing Fast Fourier Transforms if the processing is in the frequency domain, for example, or solving coupled linear equations that require pseudo matrix inversions if the processing is in the time domain. The ability to perform both real time operations and non-linear computations places relatively stringent requirements on the processing components if implemented in the same device. However, through the embodiments described herein, the requirements on the processing components can be relaxed.

In particular, the algorithms for computing the coefficients require processing with higher precision than the algorithms for applying the pre-distortion. For example, the algorithms for computing the coefficients are often implemented better using floating point processing than fixed point processing, but the coefficients do not need to be computed in real time. However, the algorithms for applying the pre-distortion should be performed in real time, but they can be implemented using fixed point precision logic.

As described above, the pre-distortion function is divided between a digital pre-distortion engine 116 in the antenna unit 104 and a coefficient computation engine 114 in the radio unit 102. Hence, the DPDE 116 can be implemented using components suited for real time processing whereas the CCE 114 can be implemented using components suited for more complex computations. For example, the DPDE 116 can be implemented, in some embodiments, using a field programmable gate array (FPGA) 117 while the CCE 114 is implemented using a digital signal processor (DSP) or general purpose processor executing instructions stored on a computer readable medium. Since the DPDE 116 does not need to perform the more complex calculations used in calculating coefficients the DPDE 116 can be implemented using faster and more efficient fixed-point processing equipment for pre-distorting the data signal in near real time or real time as opposed to both pre-distorting the signal in real time and calculating the coefficients with the same processing components. Likewise, since the CCE 114 does not need to calculate the coefficients in real time, the CCE 114 can be implemented using slower and less expensive floating point processing equipment for computing the coefficients as opposed to both pre-distorting the data signal in real time and calculating the coefficients with the same processing components. In addition, splitting the pre-distortion function into two separate device (i.e. the DPDE 116 in the antenna unit 104 and the CCE 114 in the radio unit 102) aids in meeting other requirements, such as cooling requirements, in the antenna unit 104 by reducing the amount of hardware and processing in the antenna unit 104.

Furthermore, if the digital pre-distortion were performed solely in the radio unit 102, as opposed to splitting the digital pre-distortion function between the radio unit 102 and the antenna unit 104, the feedback signal discussed above would have to be provided from the antenna unit 104, which amplifies the analog RF signal, to the radio unit 102, which is located remote from the antenna unit 104. As used herein, the term "remote" means located separate or at a distance from the other unit. In other words, the antenna unit 104 and the radio unit 102 are not co-located or located next to one another in the same area.

Providing the feedback signal to the radio unit 102 would require a separate interface between the antenna unit 104 and radio unit 102 which can accommodate a sufficiently high data rate to provide the raw samples of the feedback signal. For example, sending the raw data samples in the feedback signal can involve tens or hundreds of megabits per second. In contrast, splitting the digital pre-distortion function as described above to place the digital pre-distortion engine 116 in the antenna unit 104 eliminates the need to provide the feedback signal to the radio unit 102. Instead, the DPDE 116 provides the error signal to the CCE 114 and the CCE 114 provides the updated coefficients to the DPDE 116. The transfer of this data between the DPDE 116 and CCE 114 involves a lower data rate, such as kilobits or hundreds of bits per second, which is easier to implement than an interface to support tens or hundreds of megabits per second. For example, providing the feedback signal to the radio unit 102 would require a separate coaxial cable or a frequency diplexing unit which adds additional weight. However, the lower bandwidth required for the error signal and coefficients can be met with smaller or lighter cables and components, due to the lower bandwidth requirements. Hence, by distributing the pre-distortion function between the radio unit 102 and antenna unit 104, as described above, various advantages are achieved over systems which implement the pre-distortion function in a single device.

Figure 3:
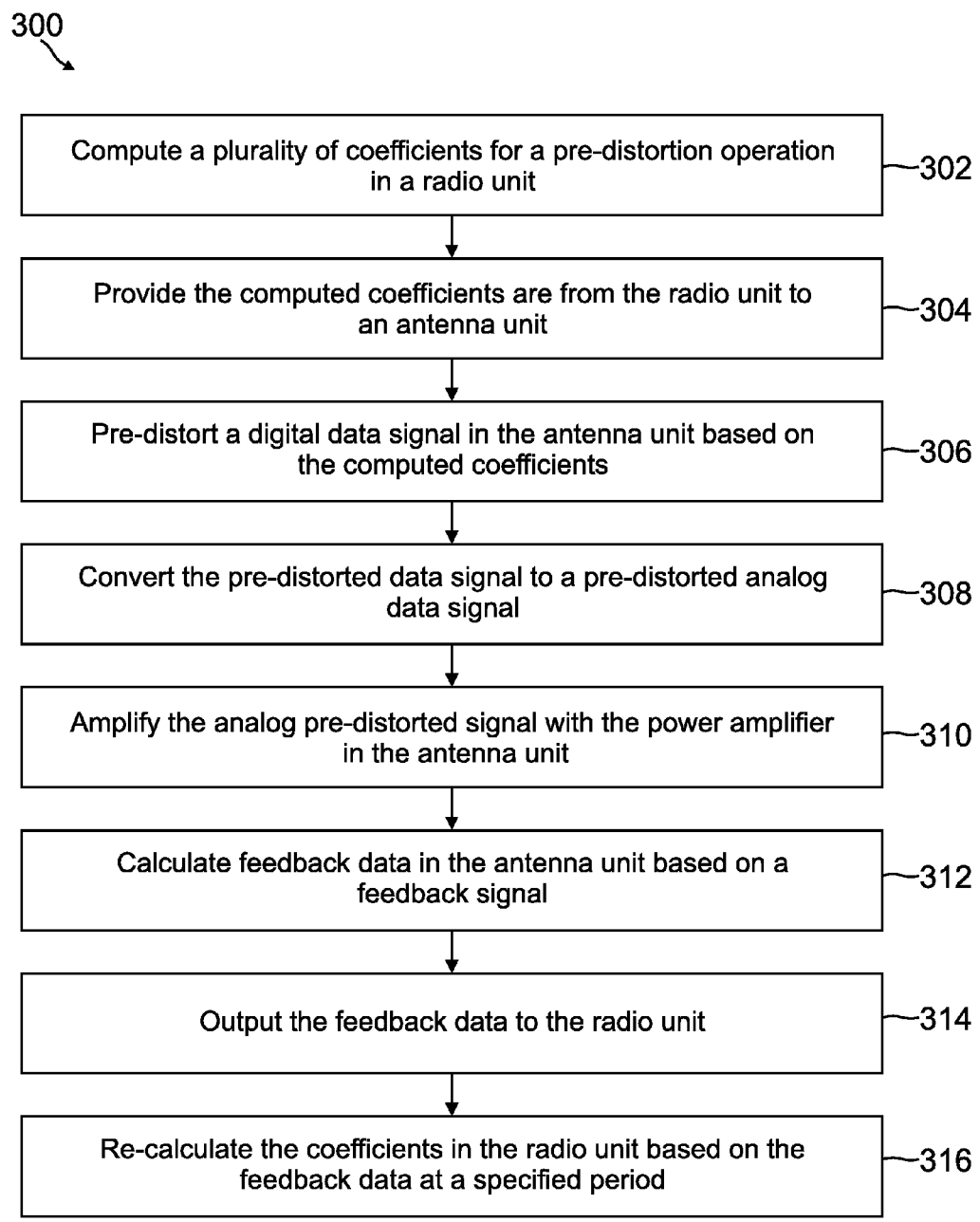
FIG. 3 is a flow chart depicting one embodiment of an exemplary method of compensating for distortion introduced by a power amplifier.

FIG. 3 is a flow chart depicting one embodiment of an exemplary method 300 of compensating for distortion introduced by a power amplifier. Method 300 can be implemented in the radio system 100 described above. At block 302, a plurality of coefficients for a pre-distortion operation is computed in a radio unit. The coefficients are computed in the radio unit such that pre-distortion applied to a digital data signal is approximately equal and opposite to distortion introduced by the power amplifier. In this way, the pre-distortion approximately cancels the distortion introduced by the power amplifier. The distortion introduced by power amplifier can be estimated through measuring the output of the power amplifier, measuring the error vector magnitude (EVM), or through empirical study of the power amplifier, for example.

At block 304, the computed coefficients are output or provided from the radio unit to an antenna unit located remote from the radio unit, as described above. In particular, the antenna unit is physically separate from the radio unit and can be located, for example, near an antenna whereas the radio unit can be located in an avionics bay of an aircraft.

At block 306, a digital data signal is pre-distorted in the antenna unit based on the computed coefficients received from the radio unit. The digital data signal is also modulated or encoded in the radio unit and provided to the antenna unit for amplification. At block 308, the pre-distorted data signal is converted to a pre-distorted analog data signal in a digital to analog converter. The analog pre-distorted data signal can also up converted from a baseband or intermediate frequency to a radio frequency prior to amplification, in some embodiments, as described above.

At block 310, the analog pre-distorted signal is amplified by the power amplifier in the antenna unit. Amplifying the analog pre-distorted data signal introduces distortion into the amplified analog pre-distorted data signal. However, as stated above, the distortion introduced by the power amplifier is approximately cancelled by the pre-distortion such that the output signal closely matches the input signal.

At block 312, feedback data is calculated in the antenna unit based on a feedback signal containing samples of the output of the power amplifier. For example, the analog output of the power amplifier can be down converted and converted to a digital signal, as described above. The digital feedback signal can then be compared to the digital data signal from the radio unit to determine a difference or error between the two digital signals. In other embodiments, other feedback data is computed based on the feedback signal, as discussed above.

At block 314, the feedback data is output to the radio unit. For example, the feedback data can be output over the same interface over which the digital data signal is communicated to the antenna unit or over a separate interface, as described above. At block 316, the radio unit re-calculates the coefficients based on the feedback data at a specified period and provides the recalculated coefficients to the antenna unit. For example, in some embodiments the radio unit can be configured to recalculate the coefficients once a second, once a minute, or once an hour, etc. In this way, changes in the power amplifier performance are compensated for, such as changes due to temperature or environmental changes.

Example Embodiments

Example 1 includes a radio system comprising: a radio unit comprising a modulator configured to modulate a digital data signal and a signal interface; an antenna unit comprising a signal interface, the antenna unit being physically separate from the radio unit and located remote from the radio unit; and a cable coupling the signal interface of the radio unit to the signal interface of the antenna unit; wherein the antenna unit further comprises: a digital pre-distortion engine configured to receive the modulated digital data signal and to pre-distort the modulated digital data signal; a digital to analog converter configured to convert the pre-distorted digital data signal to a pre-distorted analog data signal; and a power amplifier configured to amplify the pre-distorted analog data signal, wherein the power amplifier distorts the pre-distorted analog data signal, the distortion introduced by the power amplifier being opposite to the pre-distortion introduced by the digital pre-distortion engine such that the pre-distortion introduced by the digital pre-distortion engine approximately cancels the distortion introduced by the power amplifier; wherein the radio unit further comprises a coefficient computation engine configured to calculate coefficients used by the digital pre-distortion engine to pre-distort the modulated digital data signal.

Example 2 includes the radio system of Example 1, further comprising an upstream device coupled to the radio unit, the upstream device configured to provide the digital data signal to the radio unit.

Example 3 includes the radio system of Example 2, wherein the upstream device comprises one of a data link communications management unit or audio communications system.

Example 4 includes the radio system of any of Examples 1-3, wherein the digital pre-distortion engine receives a feedback signal containing samples of the output of the power amplifier, wherein the digital pre-distortion engine is configured to compute feedback data based on the feedback signal and to output the feedback data to the coefficient computation engine in the radio unit for use in re-calculating the coefficients.

Example 5 includes the radio system of Example 4, wherein the coefficient computation engine is configured to re-calculate the coefficients based on the received feedback data at a specified period such that the coefficients are not re-calculated in real time.

Example 6 includes the radio system of any of Examples 1-5, wherein the radio unit is located in an avionics bay and the antenna unit is located near an antenna remote from the avionics bay.

Example 7 includes the radio system of any of Examples 1-6, wherein the digital pre-distortion engine comprises a field programmable gate array; and wherein the coefficient computation engine comprises a digital signal processor.

Example 8 includes the radio system of any of Examples 1-7, wherein the antenna unit and the radio unit together comprise one of a satellite radio, a very high frequency (VHF) radio, or an ultra-high frequency (UHF) radio.

Example 9 includes the radio system of any of Examples 1-8, wherein the power amplifier is operated near the saturation level of the power amplifier.

Example 10 includes an antenna unit comprising: a digital pre-distortion engine configured to receive a modulated digital data signal from a physically separate radio unit located remote from the antenna unit, the digital pre-distortion engine further configured to pre-distort the modulated digital data signal; a digital to analog converter configured to convert the pre-distorted digital data signal to a pre-distorted analog data signal; and a power amplifier configured to amplify the pre-distorted analog data signal, wherein the power amplifier distorts the pre-distorted analog data signal, the distortion introduced by the power amplifier being opposite to the pre-distortion introduced by the digital pre-distortion engine such that the pre-distortion introduced by the digital pre-distortion engine approximately cancels the distortion introduced by the power amplifier; wherein the digital pre-distortion engine is configured to pre-distort the modulated digital data signal based on coefficients calculated by a coefficient computation engine in the radio unit.

Example 11 includes the antenna unit of Example 10, wherein the digital pre-distortion engine receives a feedback signal containing samples of the output of the power amplifier; wherein the digital pre-distortion engine is configured to compute feedback data based on the feedback signal and to output the feedback data to the coefficient computation engine in the radio unit for use in re-calculating the coefficients.

Example 12 includes the antenna unit of Example 11, wherein the digital pre-distortion engine is configured to receive re-calculated coefficients from the coefficient computation engine at a specified period, the specified period selected such that the recalculated coefficients are not recalculated and received in real time.

Example 13 includes the antenna unit of any of Examples 11-12, further comprising: an up converter configured to convert the pre-distorted data signal output by the digital pre-distortion engine from a baseband or intermediate frequency to a radio frequency; and a down converter configured to convert the samples of the power amplifier output from a radio frequency to a baseband or intermediate frequency.

Example 14 includes the antenna unit of Example 13, further comprising an analog to digital converter coupled to the down converter and configured to convert the output of the down converter to a digital feedback signal.

Example 15 includes the antenna unit of any of Examples 10-14, wherein the antenna unit is located remote from the radio unit and near an antenna.

Example 16 includes the antenna unit of any of Examples 10-15, wherein the digital pre-distortion engine comprises a field programmable gate array.

Example 17 includes the antenna unit of any of Examples 10-16, wherein the power amplifier is operated near the saturation level of the power amplifier.

Example 18 includes a method of compensating for distortion introduced by a power amplifier, the method comprising: computing a plurality of coefficients for a pre-distortion operation in a radio unit; providing the computed coefficients from the radio unit to an antenna unit, the antenna unit being physically separate from the radio unit and located remote from the radio unit; pre-distorting a digital data signal in the antenna unit based on the computed coefficients received from the radio unit, the digital data signal received in the antenna unit from the radio unit; converting the pre-distorted digital data signal in the antenna unit to an analog pre-distorted data signal; and amplifying the analog pre-distorted data signal with the power amplifier in the antenna unit, wherein amplifying the analog pre-distorted data signal introduces distortion into the amplified analog pre-distorted data signal; wherein the coefficients used in applying the pre-distortion are computed in the radio unit such that the pre-distortion is approximately equal and opposite to the distortion introduced by the power amplifier such that the pre-distortion approximately cancels the distortion introduced by the power amplifier.

Example 19 includes the method of Example 18, further comprising: calculating feedback data in the antenna unit based on a feedback signal containing samples of the output of the power amplifier; and outputting the feedback data to the radio unit for use in re-calculating the coefficients in the radio unit.

Example 20 includes the method of Example 19, further comprising re-calculating the coefficients in the radio unit based on the received feedback data at a specified period such that the coefficients are not re-calculated in real time.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A radio system comprising:
    a radio unit comprising a modulator configured to modulate a digital data signal and a signal interface;
    an antenna unit comprising a signal interface, the antenna unit being physically separate from the radio unit and located remote from the radio unit; and
    a cable coupling the signal interface of the radio unit to the signal interface of the antenna unit;
    wherein the antenna unit further comprises:
        a digital pre-distortion engine configured to receive the modulated digital data signal and to pre-distort the modulated digital data signal;
        a digital to analog converter configured to convert the pre-distorted digital data signal to a pre-distorted analog data signal; and
        a power amplifier configured to amplify the pre-distorted analog data signal, wherein the power amplifier distorts the pre-distorted analog data signal, the distortion introduced by the power amplifier being opposite to the pre-distortion introduced by the digital pre-distortion engine such that the pre-distortion introduced by the digital pre-distortion engine approximately cancels the distortion introduced by the power amplifier;
    wherein the radio unit further comprises a coefficient computation engine configured to calculate coefficients used by the digital pre-distortion engine to pre-distort the modulated digital data signal;
    wherein the digital pre-distortion engine receives a feedback signal containing samples of the output of the power amplifier;
    wherein the digital pre-distortion engine is configured to compute feedback data based on the feedback signal and to output the feedback data to the coefficient computation engine in the radio unit for use in re-calculating the coefficients.

2. The radio system of claim 1, further comprising an upstream device coupled to the radio unit, the upstream device configured to provide the digital data signal to the radio unit.

3. The radio system of claim 2, wherein the upstream device comprises one of a data link communications management unit or audio communications system.

4. The radio system of claim 1, wherein the coefficient computation engine is configured to re-calculate the coefficients based on the received feedback data at a specified period such that the coefficients are not re-calculated in real time.

5. The radio system of claim 1, wherein the radio unit is located in an avionics bay and the antenna unit is located near an antenna remote from the avionics bay.

6. The radio system of claim 1, wherein the digital pre-distortion engine comprises a field programmable gate array; and
    wherein the coefficient computation engine comprises a digital signal processor.

7. The radio system of claim 1, wherein the antenna unit and the radio unit together comprise one of a satellite radio, a very high frequency (VHF) radio, or an ultra-high frequency (UHF) radio.

8. The radio system of claim 1, wherein the power amplifier is operated near the saturation level of the power amplifier.

9. An antenna unit comprising:
    a digital pre-distortion engine configured to receive a modulated digital data signal from a physically separate radio unit located remote from the antenna unit, the digital pre-distortion engine further configured to pre-distort the modulated digital data signal;
    a digital to analog converter configured to convert the pre-distorted digital data signal to a pre-distorted analog data signal; and
    a power amplifier configured to amplify the pre-distorted analog data signal, wherein the power amplifier distorts the pre-distorted analog data signal, the distortion introduced by the power amplifier being opposite to the pre-distortion introduced by the digital pre-distortion engine such that the pre-distortion introduced by the digital pre-distortion engine approximately cancels the distortion introduced by the power amplifier;
    wherein the digital pre-distortion engine is configured to pre-distort the modulated digital data signal based on coefficients calculated by a coefficient computation engine in the radio unit;
    wherein the digital pre-distortion engine receives a feedback signal containing samples of the output of the power amplifier;
    wherein the digital pre-distortion engine is configured to compute feedback data based on the feedback signal and to output the feedback data to the coefficient computation engine in the radio unit for use in re-calculating the coefficients.

10. The antenna unit of claim 9, wherein the digital pre-distortion engine is further configured to receive re-calculated coefficients from the coefficient computation engine at a specified period, the specified period selected such that the recalculated coefficients are not recalculated and received in real time.

11. The antenna unit of claim 9, further comprising:
    an up converter configured to convert the pre-distorted analog data signal output by the digital pre-distortion engine from a baseband or intermediate frequency to a radio frequency; and
    a down converter configured to convert the samples of the power amplifier output from a radio frequency to a baseband or intermediate frequency.

12. The antenna unit of claim 11, further comprising an analog to digital converter coupled to the down converter and configured to convert the output of the down converter to a digital feedback signal.

13. The antenna unit of claim 9, wherein the antenna unit is located remote from the radio unit and near an antenna.

14. The antenna unit of claim 9, wherein the digital pre-distortion engine comprises a field programmable gate array.

15. The antenna unit of claim 9, wherein the power amplifier is operated near the saturation level of the power amplifier.

16. A method of compensating for distortion introduced by a power amplifier, the method comprising:
   computing a plurality of coefficients for a pre-distortion operation in a radio unit;
   providing the computed coefficients from the radio unit to an antenna unit, the antenna unit being physically separate from the radio unit and located remote from the radio unit;
   pre-distorting a digital data signal in the antenna unit based on the computed coefficients received from the radio unit, the digital data signal received in the antenna unit from the radio unit;
   converting the pre-distorted digital data signal in the antenna unit to an analog pre-distorted data signal; and
   amplifying the analog pre-distorted data signal with the power amplifier in the antenna unit, wherein amplifying the analog pre-distorted data signal introduces distortion into the amplified analog pre-distorted data signal;
   wherein the coefficients used in applying the pre-distortion are computed in the radio unit such that the pre-distortion is approximately equal and opposite to the distortion introduced by the power amplifier such that the pre-distortion approximately cancels the distortion introduced by the power amplifier;
   calculating feedback data in the antenna unit based on a feedback signal containing samples of the output of the power amplifier; and
   outputting the feedback data to the radio unit for use in re-calculating the coefficients in the radio unit.

17. The method of claim 16, further comprising re-calculating the coefficients in the radio unit based on the received feedback data at a specified period such that the coefficients are not re-calculated in real time.

\* \* \* \* \*